(12) United States Patent
Foong et al.

(10) Patent No.: US 7,554,185 B2
(45) Date of Patent: Jun. 30, 2009

(54) FLIP CHIP AND WIRE BOND SEMICONDUCTOR PACKAGE

(75) Inventors: Chee Seng Foong, Selangor (MY); Aminuddin Ismail, Selangor (MY); Wai Yew Lo, Selangor (MY); Bee Hoon Liau, Selangor (MY); Jin- Mei Liu, Tianjin (CN); Jian- Hong Wang, Tianjin (CN); Jin- Zhong Yao, Tianjin (CN); Fu- Bin Song, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/718,396

(22) PCT Filed: Oct. 31, 2005

(86) PCT No.: PCT/US2005/039610

§ 371 (c)(1),
(2), (4) Date: May 2, 2007

(87) PCT Pub. No.: WO2006/065378

PCT Pub. Date: Jun. 22, 2006

(65) Prior Publication Data

US 2008/0111248 A1 May 15, 2008

(30) Foreign Application Priority Data

Dec. 14, 2004 (MY) .............................. PI20045136

(51) Int. Cl.
*H01L 23/02* (2006.01)

(52) U.S. Cl. ..................... 257/686; 257/774; 257/778; 257/782; 257/784; 257/E25.013

(58) Field of Classification Search ................. 257/778, 257/686, 774, E25.013, 782, 784
See application file for complete search history.

(56) References Cited

U.S. PATENT DOCUMENTS

| | | |
|---|---|---|
| 5,541,450 A | 7/1996 | Jones et al. |
| 5,608,262 A | 3/1997 | Degani et al. |
| 6,249,052 B1 | 6/2001 | Lin |
| 6,407,456 B1 | 6/2002 | Ball |
| 6,426,559 B1 | 7/2002 | Bryan et al. |
| 6,437,447 B1 | 8/2002 | Huang et al. |
| 6,590,281 B2 | 7/2003 | Wu et al. |
| 6,815,829 B2 | 11/2004 | Shibata |
| 2003/0053297 A1 | 3/2003 | Gaynes et al. |
| 2004/0212068 A1* | 10/2004 | Wang .......................... 257/686 |
| 2004/0217485 A1* | 11/2004 | Chung .......................... 257/778 |
| 2004/0251531 A1* | 12/2004 | Yang et al. ................... 257/686 |

* cited by examiner

*Primary Examiner*—Long K Tran
(74) *Attorney, Agent, or Firm*—Charles Bergere

(57) ABSTRACT

A semiconductor package and method of forming the package, including a substrate having an opening formed therein. Contact pads are formed about a periphery of the opening on a first side of the substrate and a second opposing side of the substrate. A flip chip die is mounted to the substrate, having an active side mounted on a first side of the substrate and in electrical communication with at least some of the contact pads formed on the first side of the substrate. At least one wire bond die is mounted through the opening, with a non-active side mounted on the active side of the flip chip die. The wire bond die is in electrical communication with at least some of the plurality of contact pads formed on the second opposing side of the substrate.

9 Claims, 2 Drawing Sheets

250

FLIP CHIP AND WIRE BOND SEMICONDUCTOR PACKAGE

BACKGROUND OF THE INVENTION

The present invention relates, in general, to semiconductor packages, and more particularly, to a package including a very thin double-sided substrate having both wire bond and flip chip circuitry.

Higher performance, lower cost, increased miniaturization of components, and greater packaging density of integrated circuits are ongoing goals of the semiconductor industry. Obtaining greater integrated circuit density is primarily limited by the space or "real estate" available for mounting die on a substrate such as a printed circuit board. Known packaging technologies provide for simple flip chip attachment or wire bond attachment of circuitry die to a substrate. These types of integration require a specific amount of space to achieve attachment, which results in a thickness that is determinable by the die thickness and substrate thickness. Ultra thin packages are often required for use in small, portable electronic devices, which require thin packages with small footprints.

The need to reduce package size for portable electronic device applications and the like has led to several recent innovations including, packages that include multi-chip devices utilizing flip chip and wire bond assemblies, multi-chip modules with chip size package ready configurations, and multi-chip packages that utilize stacked flip chip bonding without wire bonding. These innovative designs while reducing the size of the overall package size can be further improved and result in an ultra thin package suitable for use in even smaller electronic devices.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

DETAILED DESCRIPTION OF THE PREFERRED EMBODIMENTS

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. Moreover, while specific dimensions are provided for some features, it is understood that as advances in technology occur, feature sizes and thus overall package size may decrease.

The present invention provides a double sided semiconductor package assembly that uses flip chip bonding on an uppermost surface of a substrate, and wire bonding on an opposed underneath surface of the substrate with a column ball grid array formed about the periphery of the substrate. The package uses stack die technology with a non-active side of the wire bond-die stacked on the active side of the flip-chip die. A chip-size package (CSP) substrate, including an opening formed therein, allows for the wire-bond die having a perimeter size that is smaller than the opening dimension, to pass through the opening and bond on the active side of the flip chip die. A heat sink may be attached to the top of the exposed flip chip die to enhance thermal performance.

Small portable electronic devices require small semiconductor packages to be used. Of increased interest is the use of Modified Atmosphere Packaging Chip Size Package (MAP CSP) substrates that include an opening formed therein. This unique design of the opening, aperture, or "window" CSP substrate allows for embedding of a wire bond die into the opening and results in an ultra-thin semiconductor package.

Figure 1:
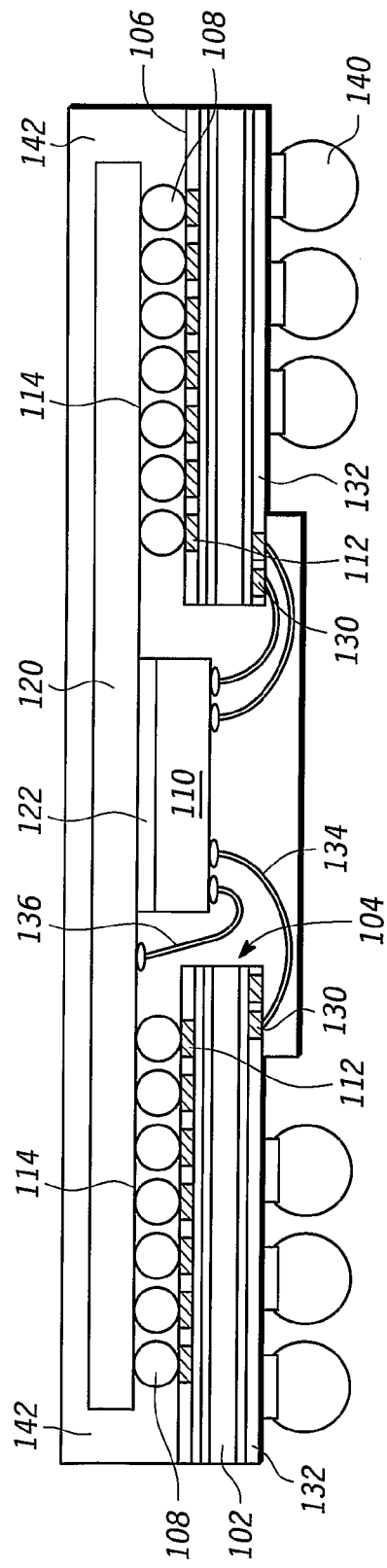
FIG. 1 is a cross-sectional view of a first embodiment of the semiconductor package according to the present invention.

Referring now to FIG. 1, a cross-sectional view of a first embodiment of an ultra thin semiconductor package 100 according to the present invention is shown. The semiconductor package 100 includes a wire-bond die 110 that is attached or stacked on the active side of a flip-chip die 120 with adhesive tape or film. The semiconductor package 100 has a substrate 102, which in this particular embodiment has an opening 104 formed therethrough. The substrate 102 is preferably a laminate substrate, such as a MAP-CSP substrate, having an opening or aperture 104 formed therein. The substrate 102 in this preferred embodiment has a thickness of about 0.35 mm and the flip-chip die 120 has a thickness of about 0.035 mm.

The flip-chip die 120 is mounted on an uppermost surface 106 of the substrate 102. The flip-chip die 120 is mounted to the substrate 102 using a plurality of standard C4 solder bump connections 108. Alternatively, conductive polymer bump or pin connections can be utilized, or other alternative means of connection well known in the art. The C4 connections 108 extend from a plurality of bond pads 112 or other terminals formed on the surface 106 of the substrate 102, and about a periphery of the opening 104 to a plurality of terminals or traces formed on a lower surface 114 of the flip-chip die 120.

The C4 connections 108 extend between the lower die surface 114 and bond pads 112 in such a manner so as to physically and mechanically attach one to the other, and make electrical contact. In this particular embodiment, the height of the C4 connections 108, subsequent to attachment to the substrate 102 and collapse is approximately 0.07 to 0.08 mm.

As illustrated in FIG. 1, the wire bond die 110 is positioned and adhered to a centralized aspect of the lower surface 114 of the flip chip die 120. The wire bond die 110 has a perimeter size less than the size/dimension of the opening 104 and is positioned within the opening 104 and in contact with the flip chip die 120. In this particular embodiment, the wire bond die 120 is attached to the active side of the flip chip die 110 using an adhesive tape or film, 122, although other adhesives maybe used, such as an epoxy. A plurality of bond pads 130 are formed on a surface 132 of the substrate 102. The wire bond die 110 is in electrical communication with the bond pads 130 using a plurality of wires 134 that extend from the wire bond die 110 to the bond pads 130. An alternative to electrically coupling the wire bond die 110 to the bond pads 130 is to directly connect one or more of the wire bond die pads to corresponding ones of the flip-chip die pads with wires, as is illustrated with wire 136. A column grid ball array (CBGA) 140 is present on the surface 132 of the substrate 102 to provide for external electrical connection to the package 100. In one embodiment, the CBGA balls 140 have a diameter of about 0.56 mm.

An overmold or fill material 142 is disposed about the flip chip die 120, the wire bond die 110 and the substrate 102 to prevent contamination of the electrical connections and to provide greater mechanical integrity to the overall package 100. As understood by those of skill in the art, the overmold/fill material 142 is usually applied before the balls 140 are formed. In one embodiment, the fill material 142 may have a thickness of about 0.05 mm measured from the non-active surface of the flip-chip die 120 to an outer surface of the package 100. Thus, in this preferred embodiment, the overall thickness of the package 100 is less than about 1.1 mm and includes a small footprint.

Figure 2:
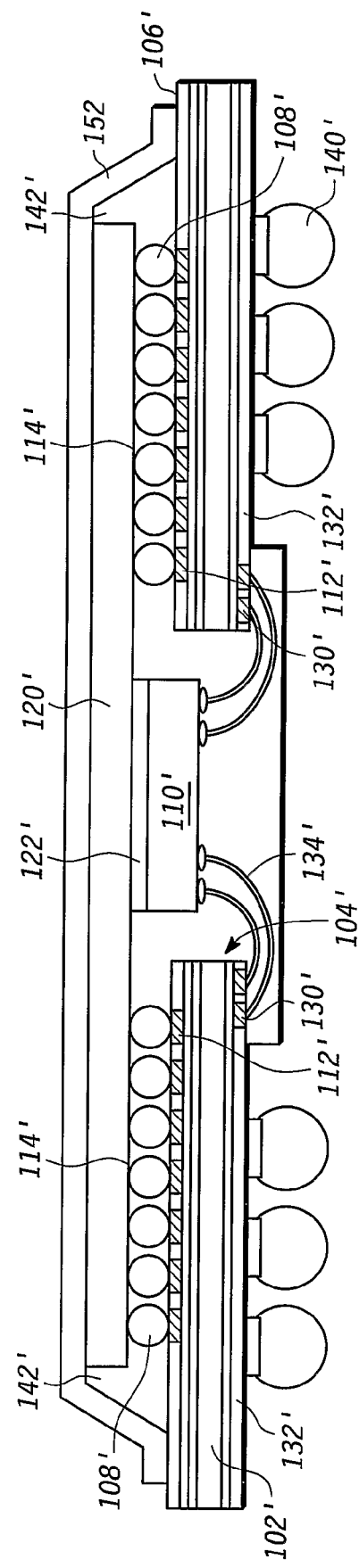
FIG. 2 is a cross-sectional view of a second embodiment of the semiconductor package according to the present invention including an improved heat dissipation means.

Referring now to FIG. 2, illustrated is a second embodiment of a semiconductor package 150 in which all essential elements are the same as those disclosed in FIG. 1, except in this particular embodiment, the package 150 includes a heat sink 152. It should be noted that all components of FIG. 2 that are similar to the components illustrated in FIG. 1, are designated with similar numbers, having a prime added to indicate the different embodiment.

The semiconductor package 150 includes a wire-bond die 110' that is stacked onto the active side of a flip-chip die 120' with adhesive tape. The semiconductor package 150 includes a substrate 102', which similar to the previous embodiment has an opening 104' formed therethrough. The substrate 102' is preferably a laminate substrate, such as a MAP-CSP substrate, having an opening or aperture 104' formed therein. The substrate 102' in this preferred embodiment has a thickness of about 0.35 mm.

The flip-chip die 120' is mounted on an uppermost surface 106' of the substrate 102'. Similar to the first embodiment, the flip-chip die 120' is mounted to the substrate 102' using a plurality of C4 solder bump connections 108'. Alternatively, conductive polymer bump or pin connections can be utilized, or other alternative means of connection well known in the art. The C4 connections 108' extend from a plurality of bond pads 112' or other terminals, formed on a surface 106' of the substrate 102', and about a periphery of the opening 104' to a plurality of terminals or traces formed on a lower die surface 114'.

The C4 connections 108' extend between the lower die surface 114' and the bond pads 112' in such a manner so as to physically and mechanically attach one to the other, and make electrical contact. In this particular embodiment, the height of the C4 connections 108', subsequent to attachment to the substrate 102' and collapse is approximately 0.07 to 0.08 mm.

As similarly illustrated in FIG. 1, the wire bond die 110' is positioned and adhered to a centralized aspect of the lower die surface 114' of the flip chip die 120'. The wire bond die 110' is of a size less than the size of opening 104', so as to be positioned within the opening 104' and in contact with the flip chip die 120'. In this particular embodiment, the wire bond die 120' is attached to the active side of the flip chip die 110 using an adhesive tape 122'. A plurality of bond pads 130' are formed on a surface 132' of the substrate 102. The wire bond die 110' is in electrical communication with the bond pads 130' using a plurality of wires 134' that extend from the wire bond die 110' to the bond pads 130'. Although not shown in FIG. 2, a wire such as the wire 136 (FIG. 1) could be used to directly connect the wire bond die 110' and a bond pad 130'. A column grid ball array 140' is present on a surface 132' of the substrate 102' to provide for external electrical connection to the package 150.

An overmold or fill material 142' is disposed about the flip chip die 120', the wire bond die 110' and the substrate 102' to prevent contamination of the electrical connections and to provide greater mechanical integrity to the overall package 150. Preferably, the overmold/fill material 142' is applied before the ball array 140' is formed.

The heat sink 152 is provided to offer increased thermal dissipation when the device has high operating temperatures. The heat sink 152 can also act as a "container" or barrier for epoxy flow during glob top encapsulation. In this embodiment, the heat sink 152 has a thickness of about 0.05 mm. In one embodiment, the heat sink 152 is fitted before the overmold material 142' is applied.

The overall package thickness of the packages 100 and 150 is preferably less than about 1.1 mm, thereby providing an ultra-thin stack-die package suitable for high performance devices that require ultra-thin profiles and small footprints. The use of three existing package technologies, wire bond, flip-chip, and stack die provides for a workable design, with substantially reduced development cycle.

Figure 3:
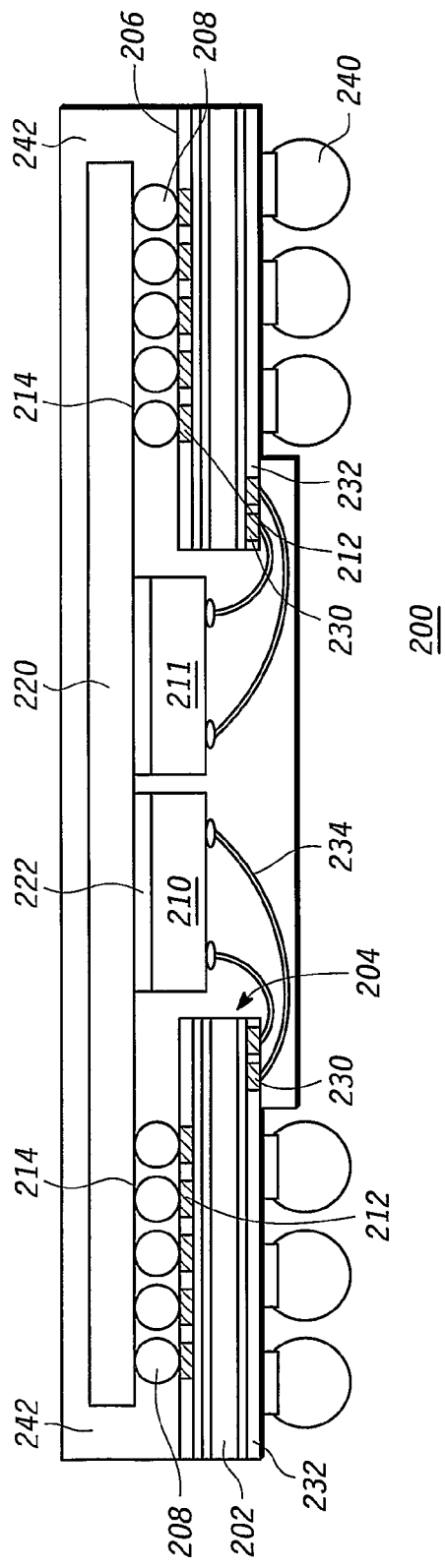
FIG. 3 is a cross-sectional view of a third embodiment of the semiconductor package according to the present invention.

Referring now to FIG. 3 illustrated in simplified sectional view is a third embodiment of an ultra thin semiconductor package 200 according to the present invention. The semiconductor package 200 includes a plurality of wire-bond die 210 and 211 that are located side-by-side and stacked onto the active side of a flip-chip die 220 with an adhesive tape, or film, 222. More specifically, the semiconductor package 200 includes a substrate 202, which in this particular embodiment has an opening 204 formed therethrough. The substrate 202, like that previously disclosed, is preferably a laminate substrate, such as a MAP-CSP substrate, having an opening or aperture 204 formed therein. The substrate 202 in this embodiment has a thickness of about 0.35 mm.

The flip-chip die 220 is mounted on an uppermost surface 206 of the substrate 202 using C4 solder bump connections 208. Alternatively, conductive polymer bump or pin connections can be utilized, or other alternative means of connection well known in the art. The C4 connections 208 extend from a plurality of bond pads 212 or other terminals, formed on the surface 206 of the substrate 202, and about a periphery of the opening 204 to a plurality of terminals formed on a lower die surface 214.

The C4 connections 208 extend between the lower die surface 214 and the bond pads 212 in such a manner so as to physically and mechanically attach one to the other, and make electrical contact. In this particular embodiment, the height of the C4 connections 208, subsequent to attachment to the substrate 202 and collapse is approximately 0.07 to 0.08 mm.

As illustrated in FIG. 3, a plurality of wire bond die, referenced as a first wire bond die 210 and a second wire bond die 211, are positioned and adhered to a centralized aspect of the lower die surface 214 of the flip chip die 220. The wire bond die 210 and 211, in combination, are of a size less than the size of the opening 204, so as to be positioned within the opening 204 and in contact with the flip chip die 220. In this particular embodiment, the wire bond die 210 and 211 are attached to the active side of the flip chip die 210 using an adhesive tape 222. A plurality of bond pads 230 are formed on a surface 232 of the substrate 202. The wire bond die 210 and 211 are in electrical communication with the bond pads 230 using a plurality of bond wires 234 that extend from the wire bond dies 210 and 211 to the bond pads 230. Although not illustrated, one or more of the bond wires could directly connect the wire bond dies 210 or 211 with the flip chip die 220. A column grid ball array 240 is present on a surface 232 of the substrate 202 to provide for external electrical connection to the package 200.

An overmold/fill material 242 is disposed about the flip chip die 220, the wire bond die 210 and 211 and the substrate 202 to prevent contamination of the electrical connections and to provide greater mechanical integrity to the overall package 200. The overmold material 242 preferably is applied prior to formation of the ball array 240.

Figure 4:
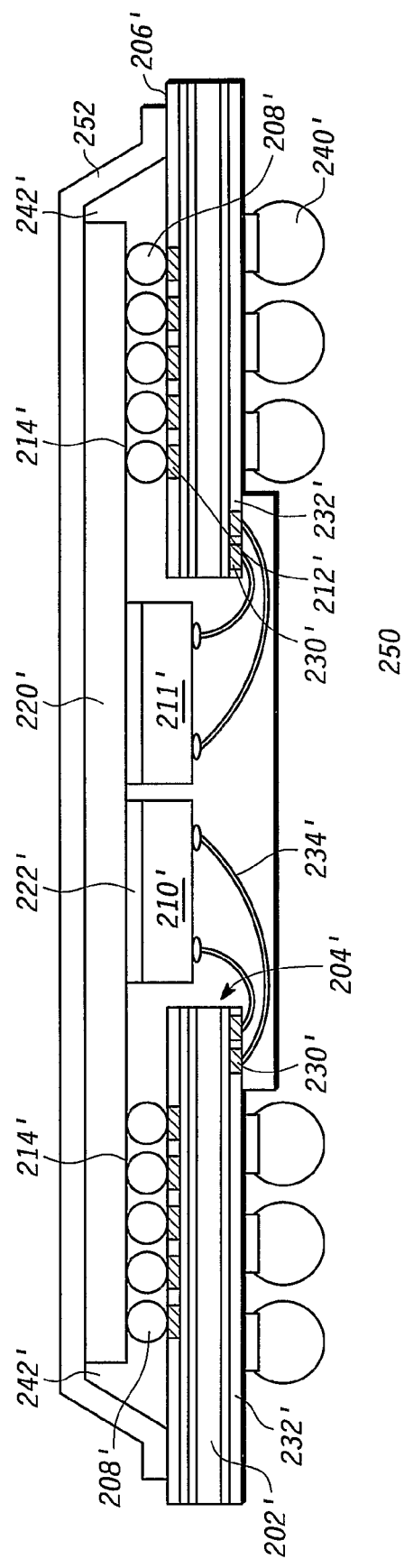
FIG. 4 is a cross-sectional view of a fourth embodiment of the semiconductor package according to the present invention including an improved heat dissipation means.

Referring now to FIG. 4, illustrated is a fourth embodiment of a semiconductor package 250 in which all essential elements are the same as those disclosed in FIG. 3, except in this particular embodiment the package 250 includes a heat sink 252. It should be noted that all components of FIG. 4 that are similar to the components illustrated in FIG. 3, are designated with similar numbers, having a prime added to indicate the different embodiment.

The semiconductor package 250 includes first and second wire-bond die 210' and 211' that are stacked onto the active side of a flip-chip die 220' with adhesive tape. More specifically, the semiconductor package 250 includes a substrate 202', which similar to the previous embodiment has an opening 204' formed therethrough. The substrate 202' is preferably a laminate substrate, such as a MAP-CSP substrate, having the opening or aperture 204' formed therein. The substrate 202' in this preferred embodiment has a thickness of about 0.35 mm.

The flip-chip die 220' is mounted on an uppermost surface 206' of the substrate 202' using a plurality of C4 solder bump connections 208'. Alternatively, conductive polymer bump or pin connections can be utilized, or other alternative means of connection well known in the art. The C4 connections 208' extend from plurality of bond pads 212' or other terminals, formed on a surface 206' of the substrate 202', and about a periphery of the opening 204' to a plurality of terminals or traces formed on a lower die surface 214'.

The C4 connections 208' extend between the lower die surface 214' and the bond pads 212' in such a manner so as to physically and mechanically attach one to the other, and make electrical contact. In this particular embodiment, the height of the C4 connections 208', subsequent to attachment to substrate 202' and collapse is approximately 0.07 to 0.08 mm.

As similarly illustrated in FIG. 3, the wire bond die 210' and 211' are positioned and adhered to a centralized aspect of the lower die surface 214' of the flip chip die 220'. The wire bond die 210' and 211' are of a size less than the size of the opening 204', so as to be positioned within the opening 204' and in contact with the flip chip die 220'. In this particular embodiment, the wire bond die 210' and 211' are attached to the active side of the flip chip die 210 using an adhesive tape 222'. A plurality of bond pads 230' are formed on a surface 232' of the substrate 202'. The wire bond die 210' and 211' are in electrical communication with the bond pads 230' using a plurality of bond wires 234' that extend from the wire bond die 210' and 211' to bond pads 230', although, as discussed above, it is possible to connect the wire bond die 210 and 211 directly to the flip chip die with wires, such as the wire 136 (FIG. 1). A column grid ball array 240' is present on the surface 232' of the substrate 202' to provide for external electrical connection to the package 250.

An overmold/fill material 242' is disposed about the flip chip die 220', the wire bond die 210' and the substrate 202' to prevent contamination of the electrical connections and to provide greater mechanical integrity to the overall package 250. As previously discussed, the overmold/fill material 242' is applied prior to formation of the column ball grid array 240'.

The heat sink 252 is provided to offer increased thermal dissipation when the device has high operating temperatures. The heat sink 252 can also act as a "container" or barrier for epoxy flow during glob top encapsulation. The heat sink 252 is fitted prior to formation of the overmold/fill material 242'.

The overall package thickness of the packages 200 and 250 is preferably less than about 1.1 mm, allowing this ultra-thin stack-die package to be suitable for high performance devices that require ultra-thin profiles and small footprints. As with the previous embodiment including a single wire bond die, this embodiment utilizing a plurality of wire bond die uses three existing package technologies, wire bond, flip-chip, and stack die provides for a workable design, with substantially reduced development cycle.

Thus, provided is a semiconductor package that includes both a flip chip die and a single wire bond die or a plurality of wire bond die. The package includes a semiconductor substrate having an opening or aperture formed therethrough, thereby providing for mounting of the non-active side of the wire bond die(s) to the active side of the flip chip die within the opening. This ability to mount the die using stack die technology within the opening provides for a decrease in overall package thickness.

The invention claimed is:

1. A semiconductor package comprising:
    a substrate, including an opening formed therein;
    a plurality of contact pads formed about a periphery of the opening on a first side of the substrate and a second opposing side of the substrate;
    a flip chip die, having an active side mounted on the first side of said substrate in electrical communication with at least some of the contact pads formed on the first side of the substrate;
    a plurality of wire bond die, each having a perimeter size of less than the dimension of the opening, and having a non-active side attached to the active side of the flip chip die, wherein the plurality of wire bond die in electrical communication with at least some of the plurality of contact pads formed on the second opposed side of the substrate;
    first wires electrically connecting the plurality of wire bond die to respective ones of the contact pads on the second side of the substrate; and
    second wires electrically connecting the plurality of wire bond die directly to the flip chip die.

2. The semiconductor package as claimed in claim 1, wherein the substrate further includes a ball grid array formed on the second opposed side of the substrate for external electrical connection.

3. The semiconductor package as claimed in claim 1, wherein the flip chip die is mounted to the first side of the substrate using a plurality of solder bumps.

4. The semiconductor package as claimed in claim 1, further including a heat sink attached to an uppermost surface of the flip chip die, wherein the heat sink is in direct contact with said uppermost surface of the flip chip die.

5. A semiconductor package comprising:
    a substrate, including an opening formed therein;
    a plurality of contact pads formed about a periphery of the opening on a first side of the substrate and a second opposing side of the substrate;
    a flip chip die, having an active side mounted on a first side of said substrate in electrical communication with at least some of the contact pads formed on the first side of the substrate; and
    a plurality of wire bond die, having a side-by-side mounting dimension of less than the dimension of the opening, the plurality of wire bond die mounted through the opening in a side-by-side formation, and having each non-active side mounted on the active side of the flip chip die, each of the plurality of wire bond die in electrical communication with at least some of the plurality of contact pads formed on the second side of the substrate.

6. The semiconductor package as claimed in claim 5, wherein the substrate further includes a ball grid array formed on the second side of the substrate for external electrical communication.

7. The semiconductor package as claimed in claim 5, wherein the flip chip die is mounted to the first side of the substrate using a plurality of solder bumps.

8. The semiconductor package as claimed in claim 5, wherein each of the plurality of wire bond die is electrically coupled to the second side of the substrate with a plurality of wires via a wire bonding process.

9. The semiconductor die package as claimed in claim 5, further including a heat sink formed on an uppermost surface of the flip chip die.

* * * * *